(12) United States Patent
Lee et al.

(10) Patent No.: US 10,670,211 B2
(45) Date of Patent: Jun. 2, 2020

(54) PHOSPHOR MODULE

(71) Applicant: LG Electronics Inc., Seoul (KR)

(72) Inventors: Jongmoo Lee, Seoul (KR); Eunyoung Kim, Seoul (KR); Mongkwon Jung, Seoul (KR); Byungwoo Jeoung, Seoul (KR)

(73) Assignee: LG Electronics Inc., Seoul (KR)

( * ) Notice: Subject to any disclaimer, the term of this patent is extended or adjusted under 35 U.S.C. 154(b) by 187 days.

(21) Appl. No.: 15/885,212

(22) Filed: Jan. 31, 2018

(65) Prior Publication Data

US 2019/0137062 A1 May 9, 2019

(30) Foreign Application Priority Data

Nov. 3, 2017 (KR) .................. 10-2017-0146199

(51) Int. Cl.
*F21S 41/16* (2018.01)
*F21S 41/176* (2018.01)
(Continued)

(52) U.S. Cl.
CPC ............ *F21S 41/16* (2018.01); *B60Q 1/0041* (2013.01); *F21K 9/64* (2016.08); *F21S 41/141* (2018.01); *F21S 41/176* (2018.01); *F21S 41/19* (2018.01); *F21S 41/192* (2018.01); *F21S 41/255* (2018.01); *F21S 41/321* (2018.01); *F21S 41/336* (2018.01); *F21S 43/16* (2018.01); *F21S 45/47* (2018.01); *F21V 29/83* (2015.01); *G02B 6/0023* (2013.01); *G02B 6/0043* (2013.01); *G02B 6/0055* (2013.01); *G02B 6/0068* (2013.01); *H01L 33/504* (2013.01)

(58) Field of Classification Search
CPC ........ F21S 41/16; F21S 41/192; F21S 41/141; F21V 29/83; F21K 9/64; G02B 6/0023; G02B 6/0043; G02B 6/0055; G02B 6/0068; H01L 33/504
USPC .......................................................... 362/84
See application file for complete search history.

(56) References Cited

U.S. PATENT DOCUMENTS

| 6,637,905 | B1 * | 10/2003 | Ng ........................ G02B 6/0026 362/601 |
| 2002/0075674 | A1 * | 6/2002 | Tufte ........................ B60Q 1/32 362/223 |

(Continued)

FOREIGN PATENT DOCUMENTS

| JP | 2012-226986 | 11/2012 |
| JP | 2014179407 | 9/2014 |

(Continued)

OTHER PUBLICATIONS

Extended European Search Report in European Application No. 18196509.6, dated Mar. 19, 2019, 7 pages.

*Primary Examiner* — Bryon T Gyllstrom
(74) *Attorney, Agent, or Firm* — Fish & Richardson P.C.

(57) ABSTRACT

A phosphor module for a laser light source includes a heat radiator, a phosphor layer disposed at the heat radiator to absorb and emit light, in which a wavelength of the emitted light is different from a wavelength of the absorbed light, and a reflective layer disposed on a surface of the phosphor layer and configured to reflect light. The phosphor layer includes a protrusion portion that protrudes from the surface of the phosphor layer and that extends through the reflective layer.

19 Claims, 9 Drawing Sheets

(51) Int. Cl.
*F21S 41/33* (2018.01)
*B60Q 1/00* (2006.01)
*F21S 41/255* (2018.01)
*F21S 41/32* (2018.01)
*F21S 45/47* (2018.01)
*F21S 43/16* (2018.01)
*F21S 41/19* (2018.01)
*F21V 29/83* (2015.01)
*F21K 9/64* (2016.01)
*F21S 41/141* (2018.01)
*F21V 8/00* (2006.01)
*H01L 33/50* (2010.01)

(56) References Cited

U.S. PATENT DOCUMENTS

| | | | | |
|---|---|---|---|---|
| 2002/0140880 | A1* | 10/2002 | Weindorf | G02B 6/0023 349/70 |
| 2004/0066140 | A1* | 4/2004 | Omoto | H05B 33/145 313/512 |
| 2004/0150991 | A1* | 8/2004 | Ouderkirk | H01L 33/46 362/231 |
| 2005/0062140 | A1* | 3/2005 | Leung | H01L 21/565 257/678 |
| 2006/0022582 | A1* | 2/2006 | Radkov | C09K 11/665 313/503 |
| 2006/0102914 | A1* | 5/2006 | Smits | H01L 33/54 257/98 |
| 2007/0097692 | A1* | 5/2007 | Suehiro | F21K 9/00 362/294 |
| 2007/0240346 | A1* | 10/2007 | Li | G09F 13/20 40/544 |
| 2010/0091491 | A1* | 4/2010 | Jiang | F21V 5/04 362/235 |
| 2011/0025190 | A1* | 2/2011 | Jagt | H01L 33/58 313/499 |
| 2013/0093313 | A1* | 4/2013 | Oyamada | H01L 33/505 313/503 |
| 2013/0250544 | A1 | 9/2013 | Zink et al. | |

FOREIGN PATENT DOCUMENTS

| | | |
|---|---|---|
| JP | 2015-195098 | 11/2015 |
| JP | 2016-058619 | 4/2016 |
| JP | 2016058624 | 4/2016 |
| KR | 10-2016-0069621 | 6/2016 |
| WO | WO2012108384 | 8/2012 |
| WO | WO2016041831 | 3/2016 |
| WO | WO2017115778 | 7/2017 |

* cited by examiner

PHOSPHOR MODULE

CROSS-REFERENCE TO RELATED APPLICATION

Pursuant to 35 U.S.C. § 119(a), this application claims the benefit of earlier filing date and right of priority to Korean Application No. 10-2017-0146199, filed on Nov. 3, 2017, the contents of which is incorporated by reference herein in its entirety.

FIELD

The present disclosure relates to a phosphor module for a laser light source.

BACKGROUND

Referring to FIG. 1, an example vehicle 1 may include a lamp unit 100 for stably providing a driver with visibility or for informing other vehicles of the driving state of the vehicle 1, for example, when the outside is low.

A vehicular lamp unit may include a head lamp installed at the front of the vehicle and a rear lamp installed at the rear of the vehicle. The head lamp is a lamp that may illuminate the front of the vehicle to lighten the front during a night operation. The rear lamp may include a brake light that may be turned on when the driver operates a brake and a turn signal light that indicates a traveling direction of the vehicle.

Referring to FIG. 2, there is a growing interest in the vehicular lamp unit 100 that uses an energy-efficient laser light source 10. For example, light emitted from a laser diode is straight, an irradiation distance thereof is long, and may not interfere with a field of view of an oncoming vehicle.

A white lamp may be implemented using the laser diode(s).

For example, light emitted from three types of laser diodes may be mixed to implement white light. In this case, each of the three laser diodes may emit light of three primary colors.

As an another example, light emitted from a blue laser diode may be converted into yellow light, and then mixed with light emitted from the blue laser diode to implement white light. In this example, white light may be implemented using one type of laser.

In some examples, a phosphor may optically convert blue light emitted from the laser diode. In this case, the laser diode emits light with very high output power, and when light emitted from the laser diode is optically converted, a temperature of the phosphor may rise to 150° C. or more.

In the case of a resin phosphor and a phosphor-in-glass (PIG, hereinafter referred to as "glass phosphor") which have been conventionally used for an LED light source, thermal quenching may occur during an optical conversion process of laser light.

In some examples, yellow light optically converted from the phosphor may be scattered and widely spread, and accordingly, part of the yellow light, which is optically converted in the phosphor, may be emitted to the outside without being mixed with the blue light. In this case, yellow ring may be generated, in which yellow light is emitted to the periphery of a light emitting region of the laser light source.

SUMMARY

One object of the present disclosure may be to provide a structure for minimizing a yellow ring generated from a phosphor module.

Another object of the present disclosure may be to provide a structure for effectively releasing heat generated during optical conversion in a phosphor module to the outside.

Another object of the present disclosure may be to provide a structure for increasing the luminance of a light source.

According to one aspect of the subject matter described in this application, a phosphor module for a laser light source includes a heat radiator, a phosphor layer disposed at the heat radiator to absorb and emit light, where a wavelength of the emitted light is different from a wavelength of the absorbed light, and a reflective layer disposed on a surface of the phosphor layer and configured to reflect light. The phosphor layer comprises a protrusion portion that protrudes from the surface of the phosphor layer and that extends through the reflective layer.

Implementations according to this aspect may include one or more of the following features. For example, the phosphor module may further include an adhesive layer between the phosphor layer and the heat radiator, the adhesive layer being configured to couple the phosphor layer to the heat radiator. The reflective layer may include an extension portion that extends from an end of the reflective layer and that covers a side surface of the phosphor layer. The adhesive layer may extend from an end of the adhesive layer toward the extension portion of the reflective layer to thereby couple the extension portion of the reflective layer to the heat radiator.

In some implementations, the heat radiator may define a recess having a plurality of side surfaces and a bottom surface, and the phosphor layer may be disposed on the bottom surface of the recess. The phosphor module may further include an adhesive layer disposed at the bottom surface of the recess and configured to couple at least one of the phosphor layer or the reflective layer to the bottom surface of the recess. In some examples, the adhesive layer may include a first region disposed on the bottom surface of the recess, and a second region that extends from the first region along a side surface of the recess among the plurality of side surfaces, where the second region of the adhesive layer is configured to couple at least one of the phosphor layer or the reflective layer to the side surface of the recess.

In some implementations, the bottom surface of the recess may include a plurality of protrusions and a plurality of recesses. The phosphor module may further include a reflective film disposed between the adhesive layer and the phosphor layer and configured to reflect light. The reflective layer may be made of a first material, and the reflective film may be made of a second material that is different from the first material. The reflection film may include a first layer that contacts the adhesive layer, the first layer comprising a metal material or an alloy, and a second layer disposed on the first layer and configured to couple the first layer of the reflection film to the phosphor layer.

In some examples, the adhesive layer may include a S—Ag—Cu-based soldering material, a Sn—Au-based soldering material, a Sn—Bi-based soldering material, or an Ag-containing resin material. The reflective layer may include a mixture of titanium oxide and at least one of alumina ($Al_2O_3$), spinel ($MgAl_2O_4$), or aluminum oxynitride (AlON). In some cases, the reflective layer may include a ceramic material configured to transmit heat generated from the phosphor layer to the reflective layer. In some examples, the reflective layer may include $TiO_2$, $Ti_2O_3$, or $Al_2O_3$.

In some implementations, a top surface of the protrusion portion of the phosphor layer and a top surface of the reflective layer are coplanar with a top surface of the heat radiator. In some examples, a lower surface of the phosphor layer contacts the adhesive layer, and a side surface of the phosphor layer contacts a side surface of the recess among the plurality of side surfaces. In some cases, the second region of the adhesive layer is configured to contact a side surface of each of the reflective layer and the phosphor layer and to couple the side surface of each of the phosphor layer and the reflective layer to the side surface of the recess.

In some implementations, the protrusion portion of the phosphor layer include a first surface that contacts the reflective layer, and a second surface that is exposed to an outside of the heat radiator. In some examples, the phosphor module may further include an adhesive layer disposed between the heat radiator and the phosphor layer and configured to define a space between the reflective layer and the heat radiator.

In some examples, heat generated during an optical conversion in a phosphor layer may be efficiently emitted to the outside, and light reflected from the side surface of the phosphor layer may be directed to the front surface of the phosphor layer, thereby increasing the luminance of the light source.

DETAILED DESCRIPTION

Figure 1:
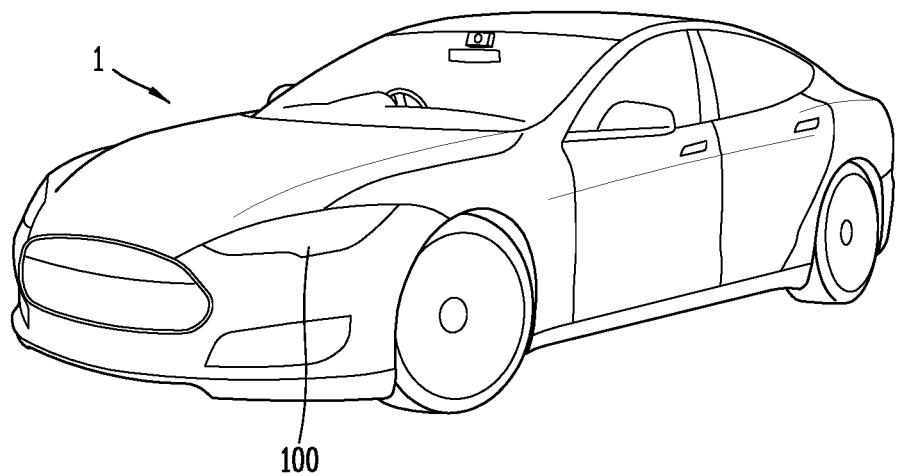
FIG. 1 is a conceptual view illustrating an example vehicle.
Figure 2:
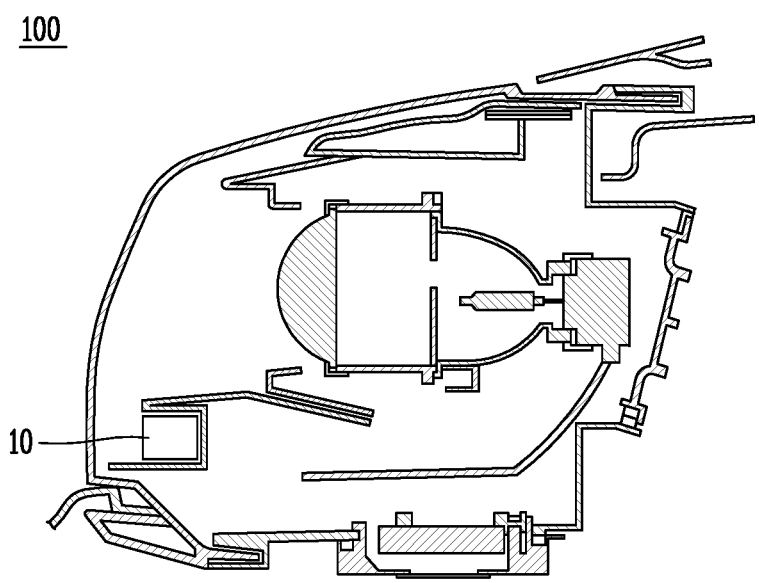
FIG. 2 is a cross-sectional view illustrating an example lamp unit included in the vehicle.

Hereinafter, the implementations disclosed herein will be described in detail with reference to the accompanying drawings, and the same or similar elements are designated with the same numeral references regardless of the numerals in the drawings and their redundant description will be omitted.

Prior to describing a phosphor module, a laser light source using the phosphor module will be described.

Figure 3:
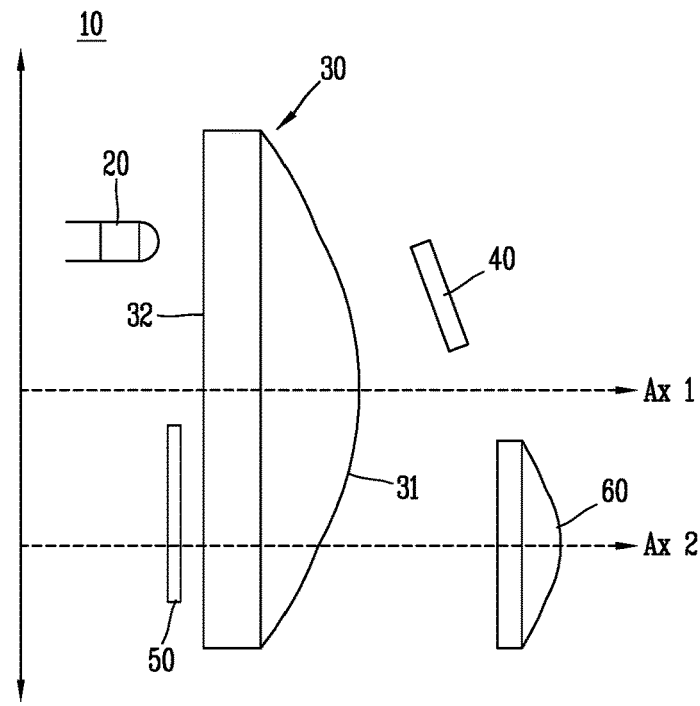
FIG. 3 is a conceptual view illustrating an example reflective laser light source.
Figure 4:
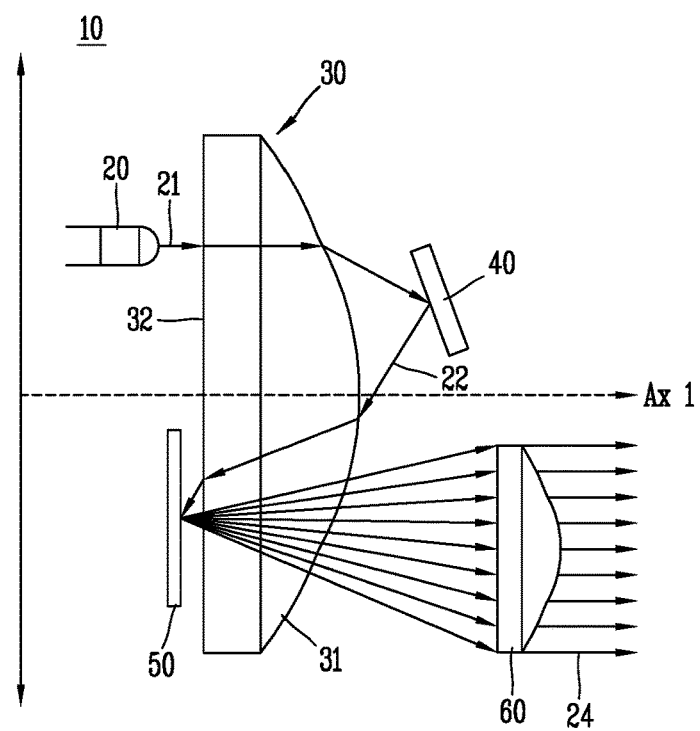
FIG. 4 is a conceptual view illustrating an example traveling path of light in the reflective laser light source illustrated in FIG. 3.

FIG. 3 is a conceptual view illustrating an example reflective laser light source, and FIG. 4 is a conceptual view illustrating an example traveling path of light in the reflective laser light source illustrated in FIG. 3.

The laser light source 10 may be implemented through the structure of FIG. 3. Referring to FIG. 3, the laser light source 10 may include a blue laser diode 20, a condenser lens 30, a reflector 40, a phosphor module 50, and an auxiliary condenser lens 60.

For example, referring to FIG. 4, blue light 21 emitted from the blue laser diode 20 passes through the condenser lens 30 and is reflected by the reflector 40. The blue light 22 reflected by the reflector 40 passes again through the condenser lens 30 and is incident on the phosphor module 50.

Part of the blue light incident on the phosphor module 50 is converted into yellow light. In some examples, since the phosphor module 50 includes a reflective layer, it reflects part of the blue light incident on the phosphor module 50. Accordingly, yellow light and the blue light reflected by the phosphor module 50 are combined to become white light. The white light is condensed by the auxiliary condenser lens 60 and then emitted to the outside 24.

In this specification, the laser light source having the structure described in FIGS. 3 and 4 is referred to as a "reflective laser light source." As described above, the reflective laser light source includes the phosphor module 50.

The phosphor module 50 includes a phosphor layer for converting blue light into yellow light, but due to the characteristics of a laser diode with high power output, when a resin phosphor or a glass phosphor, which has been used for an LED light source in the related art or the like, is used for optical conversion of a laser diode, there is a problem that thermal quenching occurs in the phosphor.

In some examples, ceramic phosphors have been used to solve a problem that occurs when laser light is optically converted using a resin phosphor or a glass phosphor. However, in the case of a ceramic phosphor, since the sintering temperature may be as high as 1500° C. or more, it may be difficult to control a particle size and pore of the ceramic phosphor.

In examples where the particle size and pore of the phosphor layer may not be controlled, a scattering degree in the phosphor layer may be increased. When a scattering factor thereof increases in the case of being included in the phosphor layer, a phenomenon (hereinafter referred to as a "yellow ring") in which yellow light is emitted to the periphery of a light emitting region of the laser light source may occur.

The present disclosure provides a structure of a phosphor module capable of minimizing a yellow ring even when a ceramic phosphor whose scattering degree is difficult to control is used.

For example, the present disclosure may minimize an area of a phosphor layer included in the phosphor module. When the area of the phosphor layer is reduced, an area of the yellow ring also decreases, but some problems may arise.

First, when the area of the phosphor layer is reduced, an optical conversion efficiency of the phosphor layer may be reduced. Accordingly, when laser light is irradiated to the phosphor module, the brightness of light emitted from the phosphor module may be reduced. Therefore, in a phosphor module in the related art, an area of the phosphor layer may not be reduced to a predetermined level or less.

Second, when the area of the phosphor layer is reduced, a contact area between the phosphor layer and the heat radiator may be reduced, thereby decreasing heat dissipation efficiency, and causing thermal quenching in the phosphor layer.

The present disclosure describes an example that may reduce the area of the phosphor layer to a predetermined level or less. Through this, the present disclosure minimizes an area of the yellow ring. Hereinafter, the structure of the phosphor module will be described in detail.

The phosphor module may not emit light by itself, but emits light through optical conversion when irradiated with laser light. In the present specification, the expression "brightness of the phosphor module" denotes the brightness of light output from the phosphor module when laser light is irradiated to the phosphor module. In some examples, the expression "brightness of the phosphor module" may vary depending on an amount of laser light irradiated to the phosphor module, but the expression "increase/decrease in brightness of the phosphor module" indicates a result in which the amounts of light of the output light are compared when the same amount of light is irradiated to the phosphor module.

In some examples, an upward direction of the phosphor module 200 is defined as a direction in which a reflective surface for reflecting the light traveling to the phosphor module faces. Hereinafter, an upper or lower surface of the constituent elements constituting the phosphor module is defined according to these reference. For example, light directed toward a lower side of the phosphor module is light that is not output to the outside, whereas light directed toward an upper side of the phosphor module is light output to the outside. An amount of light of the phosphor module is determined by an amount of light directed toward the upper side of the phosphor module.

FIGS. 5A through 6C are cross-sectional views illustrating example phosphor modules.

The phosphor module 200 may include a heat radiator 210, a phosphor layer 220, and a reflective layer 230. Hereinafter, the above-described components will be described in detail.

The heat radiator 210 is disposed below the phosphor layer 220 to improve the heat radiation performance of the phosphor module 50. The heat radiator 210 quickly releases heat generated during optical conversion in the phosphor layer 220 to prevent the phosphor layer 220 from being thermally quenched. As a contact area between the phosphor layer 220 and the heat radiator 210 becomes larger, a heat dissipation efficiency of the heat radiator 210 may be increased.

The heat radiator 210 may reflect blue light that has passed through the phosphor layer 220 and yellow light emitted from the phosphor layer 220. However, a reflecting function of the heat radiator 210 is an additional function but not an essential function. When a reflective material is disposed between the heat radiator 210 and the phosphor layer 220, the heat radiator 210 does not need to perform the reflecting function.

The heat radiator 210 may be made of a metal or an alloy having a high thermal conductivity. For example, the heat radiator 210 may be made of an Al alloy (ADC12, AC4C).

The phosphor layer 220 is disposed on an upper side of the heat radiator 210. The phosphor layer 220 absorbs the irradiated laser light and emits light of a wavelength different from that of the absorbed laser light.

For example, the phosphor layer 220 absorbs blue light emitted from the laser diode to emit yellow light. For this purpose, the phosphor layer 220 may include a yellow phosphor. For example, the phosphor layer 220 may include at least one of YAG:Ce, LuAG:Ce, $Sr_2SiO_4$:Eu, and a nitride-based yellow phosphor.

In some examples, the phosphor layer 220 may be formed of a mixture of a phosphor and a base material. In general, phosphors are sintered and molded in a predetermined shape for use, and the base material is a material used for ensuring sinterability for phosphor sintering. the type of the phosphor layer may vary according to the type of the base material. For example, when the base material is a glass frit, the phosphor layer is a glass phosphor, and when the base material is a ceramic, the phosphor layer is a ceramic phosphor.

Depending on the type of the base material, the physical and optical properties of the phosphor layer 220 may be varied. Here, the physical properties that can vary according to the type of the base material are the heat radiation performance of the phosphor layer 220. Compared to the ceramic phosphor, the heat radiation performance of the glass phosphor is low. When the glass phosphor is used for the optical conversion of laser light with high output power, the glass phosphor cannot rapidly release heat energy generated during the optical conversion process to the outside, and thus the phosphor contained in the glass phosphor is deteriorated. For example, when laser light is optically converted, the temperature of the phosphor layer 220 may be raised to 150° C. or higher, and the phosphor may deteriorate at the temperature.

In some examples, the physical properties that can be changed depending on the type of the base material is a degree of scattering in the phosphor layer. Boundaries, pores, and bonds between particles made of base materials may be scattering factors that scatter light that is optically converted from the phosphor. When the scattering factors are increased in the phosphor layer, since the optically converted yellow light spreads widely around the phosphor module, it is emitted to the outside without being combined with blue light. As a result, a yellow ring is formed around the laser light source.

An area of the yellow ring decreases as an area of the phosphor layer 220 becomes smaller. The present disclosure uses a ceramic phosphor and reduces the area of the phosphor layer 220 to minimize the yellow ring.

When the area of the phosphor layer 220 is reduced, the above-described two problems may arise. The present disclosure may provide a structure of the phosphor layer 220 for improving the heat dissipation performance and a structure of the reflective layer 230 disposed at an edge of the phosphor layer 220.

First, the structure of the phosphor layer 220 may be described.

The phosphor layer 220 includes a body portion 221 having a flat shape and a protrusion portion 222 protruded upward from a center portion of the body portion 221.

Since an upper surface of the body portion 221 is covered with the reflective layer 230 which will be described later, most of the body portion 221 is not exposed to the outside. A portion substantially exposed to the outside in the phosphor layer 220 is the protrusion portion 222. An area of the phosphor layer described in the present specification denotes an area of the protrusion portion 222.

The body portion 221 prevents the heat radiation efficiency from deteriorating as the area of the protrusion portion 222 is reduced. For example, since the body portion 221 increases a contact area between the phosphor layer 220 and the heat radiator 210, the heat radiation performance of the phosphor layer module does not decrease even when the area of the protrusion portion 222 is reduced.

Next, the present disclosure includes a reflective layer 230 disposed at an edge of the phosphor layer 220 while the area of the phosphor layer 220 is reduced.

Figure 5A:
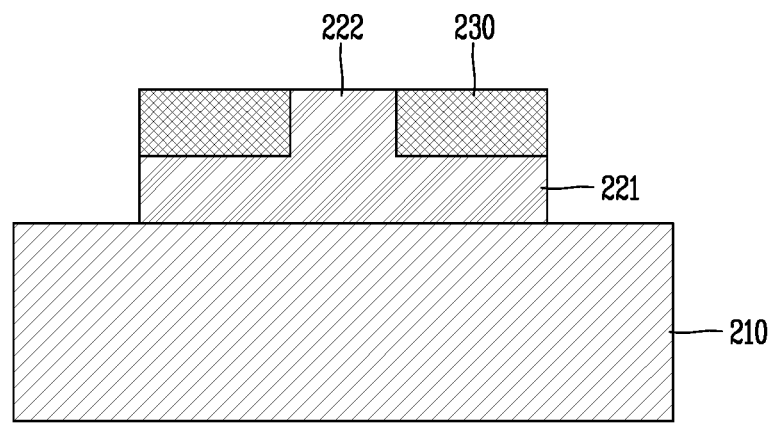
FIGS. 5A and 5B are cross-sectional views illustrating an example phosphor module.
Figure 5B:
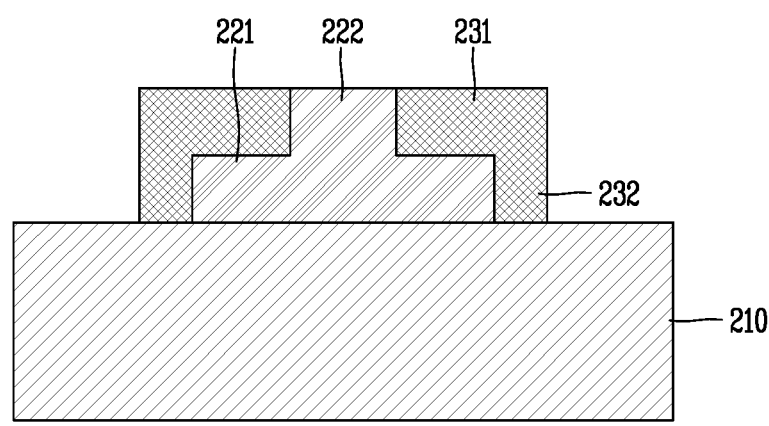

For example, as illustrated in FIG. 5A, the reflective layer 230 is disposed at an edge of an upper surface of the body portion 221 of the phosphor layer 220. The reflective layer 230 is configured to cover an upper surface of the body 221 and surround a side surface of the protrusion portion 222. The role of the reflective layer 230 may be roughly classified into two types.

First, the reflective layer 230 performs the role of reflect light directed toward the side surface of the protrusion portion 222. The reflective layer 230 reflects light traveling toward the side surface of the protrusion portion 222 to allow the light to travel to an upper side of the phosphor layer 220. Through this, the reflective layer 230 increases a ratio of an amount of light directed upward of the phosphor layer 220 to a total amount of yellow light output from the phosphor layer 220. Accordingly, the brightness of the phosphor module may be increased.

In addition, yellow light traveling toward the side surface of the protrusion portion 222 spreads widely around the phosphor module, and the reflective layer 230 reduces an amount of yellow light spreading widely around the phosphor module, thereby reducing an area of the yellow ring.

As described above, the reflective layer 230 may reflect yellow light traveling to the side surface of the phosphor layer 220, thereby increasing the brightness of the phosphor module and reducing the area of the yellow ring.

Second, the reflective layer 230 performs a heat dissipation function for the phosphor layer 220. When the area of the phosphor layer 220 is reduced, a contact area between the phosphor layer 220 and the heat radiator 210 may be reduced, thereby reducing the heat dissipation efficiency. In order to compensate for this, the reflective layer 230 emits heat generated in the phosphor layer 220 to the side surface of the phosphor layer 220. In particular, the reflective layer 230 emits heat generated in the protrusion portion 222 to the side surface of the protrusion portion 222.

In some examples, the reflective layer 230 may have a structure with improved heat radiation performance. For example, referring to FIG. 5B, the reflective layer 230 may have an extension portion 232 extended to cover a side surface of the phosphor layer 220 at an edge of the reflective layer 230. The extension portion 232 transfers heat generated from the protrusion portion 222 to the heat radiator 210 to improve the heat dissipation performance of the phosphor module.

In some implementations, since the extension portion 232 surrounds a side surface of the body portion 221, the extension portion 232 may perform the role of reflecting light traveling toward the side surface of the body portion 221 to prevent light loss.

In order for the reflective layer 230 to perform the above-described two functions, the reflective layer 230 should be made of a material having a high reflectance and a high thermal conductivity. For example, the reflective layer may be made of at least one of $TiO_2$, $Ti_2O_3$, or $Al_2O_3$.

In some examples, the reflective layer 230 may be formed by etching part of the prefabricated phosphor layer, filling a material of the reflective layer 230 at the etched position, and then calcining the material. Therefore, an additional adhesive material need not be disposed between the phosphor layer 220 and the reflective layer 230. However, since the phosphor layer 220 and the heat radiator 210 are separately fabricated and assembled, an additional adhesive material may be disposed between the phosphor layer 220 and the heat radiator 210.

Figure 6A:
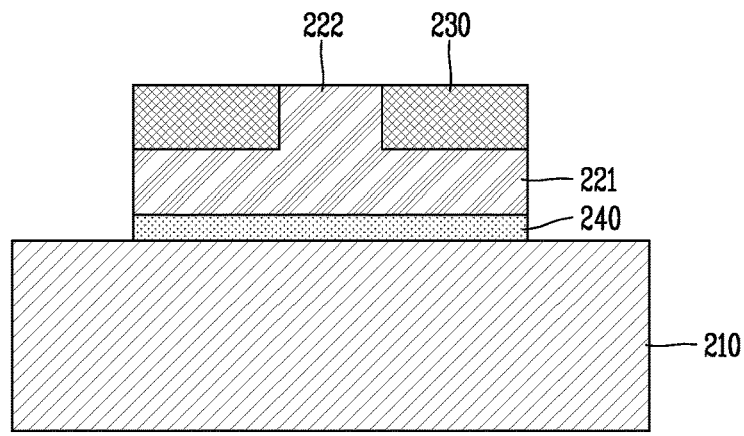
FIGS. 6A, 6B, and 6C are cross-sectional views illustrating an example phosphor module.
Figure 6B:
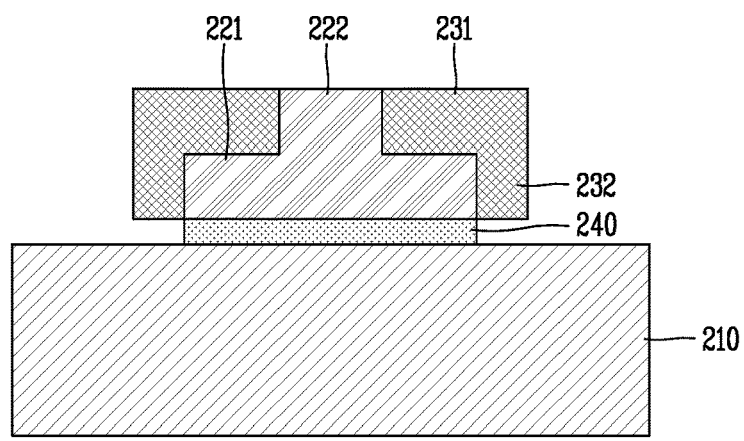

For example, as illustrated in FIGS. 6A and 6B, the adhesive layer 240 may bond the phosphor layer 220 to the heat radiator 210. In this example, the adhesive layer 240 is disposed between the phosphor layer 220 and the heat radiator 210.

The adhesive layer 240 may be made of a material having a high thermal conductivity because the heat of the phosphor layer 220 is transferred to the heat radiator 210. In some examples, a thermal conductivity of the adhesive layer 240 should be higher than that of the phosphor 220. Through this, the adhesive layer 240 may rapidly transfer the heat of the phosphor 220 and the reflective layer 230 to the heat radiator 210.

In some examples, when a reflectance of the heat radiator 210 is lower than a predetermined level, the adhesive layer 240 may be made of a material having a high reflectance. For example, the adhesive layer 240 may be made of a white bonding material containing at least one of $Al_2O_3$, $SiO_2$, $ZrO_2$ or $ZnO$ having a reflectance of 90% or more in the visible light region, or may be made of a metal bonding material containing more than 90 wt. % of silver. Here, the adhesive layer 240 may serve as a reflective layer.

In some cases, when a reflectance of the heat radiator 210 is higher than a predetermined level, the adhesive layer 240 may be made of a material having a high light transmittance. For example, the adhesive layer 240 may include at least one of poly-methyl methacrylate (PMMA), polyurethane (PU), poly-carbonate (PC), or siloxane-based bonding materials.

Figure 6C:
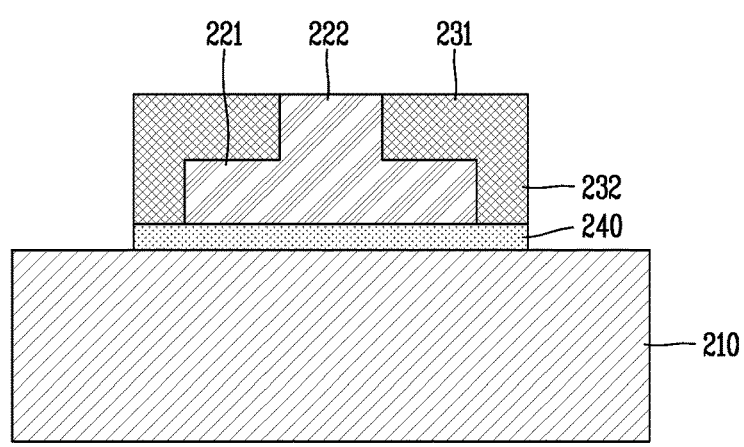

In some examples, as illustrated in FIG. 6C, when the reflective layer 230 includes the extension portion 232, the adhesive layer 240 may be formed to extend from one end of the adhesive layer 240 in the direction of the extension portion 23 to bond the extension portion 232 to the heat radiator 210. Through this, the adhesive layer 240 bonds the reflective layer 230 to the heat radiator 210, and allows the heat of the reflective layer 230 to be quickly transferred to the heat radiator 210.

As described above, the area of the phosphor layer used in the phosphor module may be reduced to a predetermined level or less. Through this, the present disclosure minimizes an area of the yellow ring.

In some examples, the present disclosure provides various modified implementations for solving the problems that arise when the area of the phosphor layer is reduced. Hereinafter, the modified implementations of the present disclosure will be described with reference to the accompanying drawings.

The present disclosure may provide a structure for simultaneously increasing the thermal conductivity and reflectance of the reflective layer.

The reflective layer 230 may be capable of rapidly releasing heat generated from the phosphor layer 220 to the outside while at the same time reflecting light directed toward a side surface of the phosphor layer 220 to an upper side of the phosphor layer 220.

The reflective layer may include a plurality of layers. For example, the reflective layer 230 may include a first reflective layer in contact with a side surface of the protrusion portion 222 and a second reflective layer surrounding the first reflective layer.

For example, a reflectivity of a material forming the first reflective layer may be higher than that of a material forming the second reflective layer. In some examples, a thermal conductivity of the material forming the second reflective layer may be higher than that of the material forming the first reflective layer.

Through the above-described first and second reflective layers, the present disclosure may increase the reflectance of the reflective layer while at the same time increasing the thermal conductivity of the entire reflective layer. In some examples, the thicknesses of the first and second reflective layers may be different from each other. For example, a width of the first reflective layer may be smaller than that of the second reflective layer. The first reflective layer may be formed only to a thickness sufficient to allow the reflective layer 230 to perform a reflective function and the second reflective layer performing a heat dissipation function may be formed to have a greater width, thereby maximizing the reflectance and heat dissipation efficiency of the reflective layer 230.

However, the present disclosure is not limited to thereto, and the reflective layer 230 may not be formed with a plurality of layers. For example, the reflective layer 230 may be a mixture of a material having a high reflectivity and a material having a high thermal conductivity. For example, the reflective layer 230 may include a mixture of titanium oxide and at least one of alumina ($Al_2O_3$), spinel ($MgAl_2O_4$), or aluminum oxynitride (AlON). When a reflective layer is formed by mixing an aluminum oxide material having a high thermal conductivity and a titanium oxide having a high reflectivity, the reflectance and thermal conductivity of the reflective layer may be increased together.

In some examples, the present disclosure may increase the thermal conductivity of the reflective layer using the above-described heat radiator.

FIGS. 7A through 9B are cross-sectional views illustrating example phosphor modules including a heat radiator having a hole.

Figure 7A:
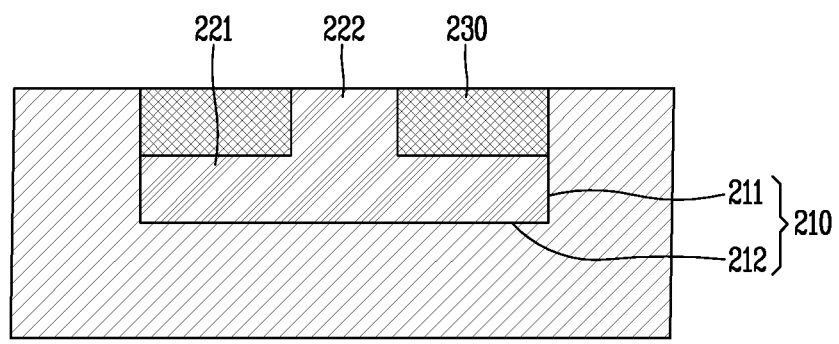
FIGS. 7A and 7B are cross-sectional views illustrating an example phosphor module including an example heat radiator having an example hole.
Figure 7B:
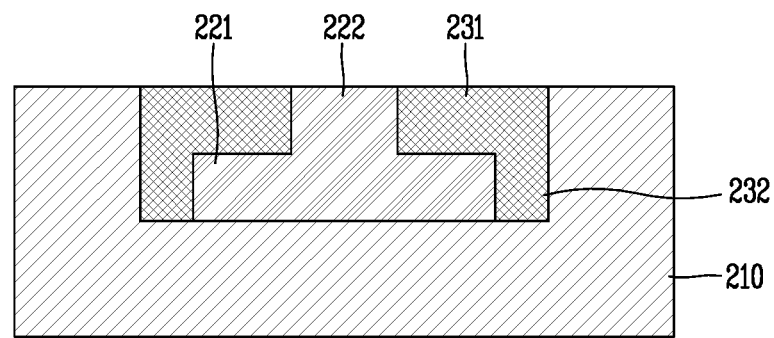

A hole or recess may be formed in the heat radiator included in the phosphor module. Referring to FIGS. 7A and 7B, the heat radiator may have a hole having a plurality of side surfaces 211 and a bottom surface 212.

At this time, the phosphor layer 220 and the reflective layer 230 may be disposed on the bottom surface 212. Here, a thickness of the phosphor layer 220 and the reflective layer 230 may be equal to or less than a depth of the hole. In this case, the phosphor layer 220 and the reflective layer 230 are disposed inside the hole.

Referring to FIG. 7A, since the side surfaces of the body portion 221 and the reflective layer 230 are in contact with the side surface of the hole, the heat of the body portion 221 and the reflective layer 230 may be rapidly transferred to the heat radiator 210.

In some examples, referring to FIG. 7B, since the side surface of the reflective layer 230 and the side surface of the hole are in contact with each other, the heat of the reflective layer 230 may be rapidly transferred to the heat radiator 210.

As described above, the structure shown FIGS. 7A and 7B may improve the heat radiation performance of the phosphor module.

Figure 8A:
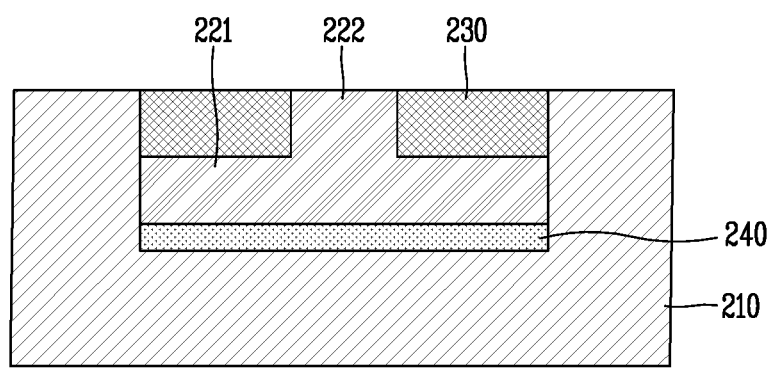
FIGS. 8A and 8B are cross-sectional views illustrating an example phosphor module including an example heat radiator having an example hole.

In some examples, as illustrated in FIG. 8A, in order to fix the phosphor layer 220 to the hole, an adhesive layer 240 may be formed on the bottom surface 212 of the hole. The adhesive layer 240 transfers the heat of the phosphor layer 220 to the heat radiator 210.

Figure 8B:
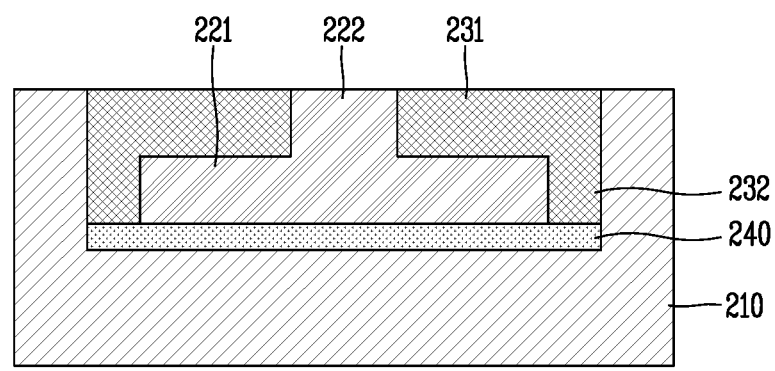

In some examples, as illustrated in FIG. 8B, when the reflective layer 230 includes the extension portion 232, the adhesive layer 240 fixes the phosphor layer 220 and the reflective layer 230 to the hole. At this time, the adhesive layer 240 transfers the heat of the phosphor layer 220 and the reflective layer 230 to the heat radiator 210.

In some examples, the structure illustrated in FIGS. 8A and 8B may be fabricated by forming a hole in the heat radiator 210, and then coating an adhesive on the bottom surface of the hole, and then arranging the phosphor layer 220 and the reflective layer 230 on the coated adhesive body. Here, when adjusting an amount of the adhesive coated on the bottom surface of the hole, the structure of the phosphor module may have a structure as illustrated in FIGS. 9A and 9B.

Figure 9A:
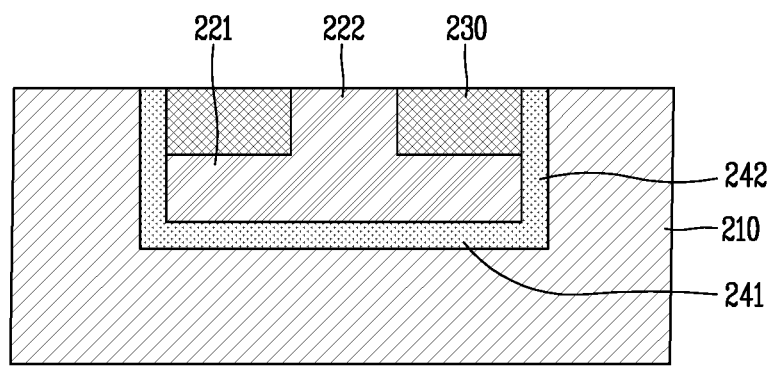
FIGS. 9A and 9B are cross-sectional views illustrating an example phosphor module including an example heat radiator having an example hole.

For example, as illustrated in FIG. 9A, the adhesive layer 240 may include a first region 241 formed between the bottom surface and the phosphor layer 220, and a second region 242 extended from the first region 241 along one side surface of the reflective layer 230 to bond one side surface of the reflective layer 230 and one side surface of the reflective layer 230 to a side surface provided on the hole.

Figure 9B:
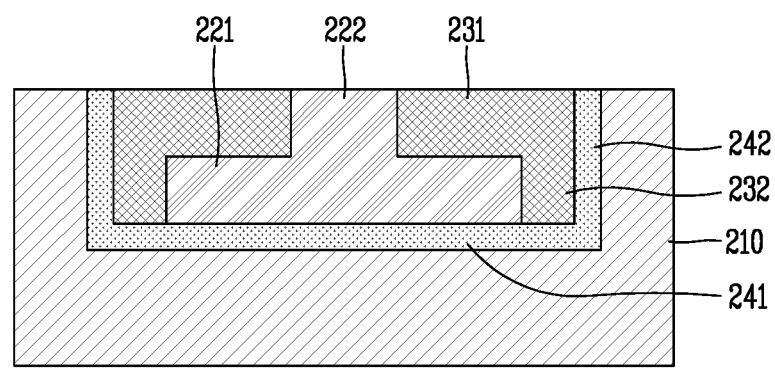

In some examples, as illustrated in FIG. 9B, when the reflective layer 230 includes the extension portion 232, the adhesive layer 240 may have a first region 241, and a second region 242 extended from the first region 241 along one side surface of the reflective layer 230 to bond one side surface of the reflective layer 230 to a side surface provided on the hole.

In other words, in case where the phosphor layer 220 and the reflective layer 230 are disposed on the adhesive coated on the bottom surface of the hole, when a predetermined amount or more of the adhesive is coated, the adhesive is infiltrated into a space between a side surface of the body portion 221 and the reflective layer 230 and a side surface of the hole. Due to this, it may increase a contact area between the adhesive layer 240 and the phosphor layer 220 and the reflective layer 230 and between the adhesive layer 240 and the heat radiator 210, thereby increasing a durability of the phosphor module. Also, since the second region 242 can quickly discharge the heat of the phosphor layer 220 and the reflective layer 230 to a side surface of the reflective layer 230, the heat dissipation performance of the phosphor module may be improved.

As described above, when a hole is formed in the heat radiator 210 and the phosphor layer 220 and the reflective layer 230 are disposed in the hole, the durability and heat radiation performance of the phosphor module may be improved.

In some examples, a concavo-convex structure may be formed on the bottom surface of the hole. A width of the phosphor layer disposed inside the hole is several tens of micrometers. Due to this, a width of the hole is also formed to be several tens of micrometers. Accordingly, a horizontal or vertical length of the bottom surface of the hole is formed to be several tens of micrometers. As described above, since the bottom surface of the hole is very narrow, it is very difficult to form the bottom surface of the hole in a flat manner, and a concavo-convex structure may be formed on the bottom surface of the hole.

Figure 10:
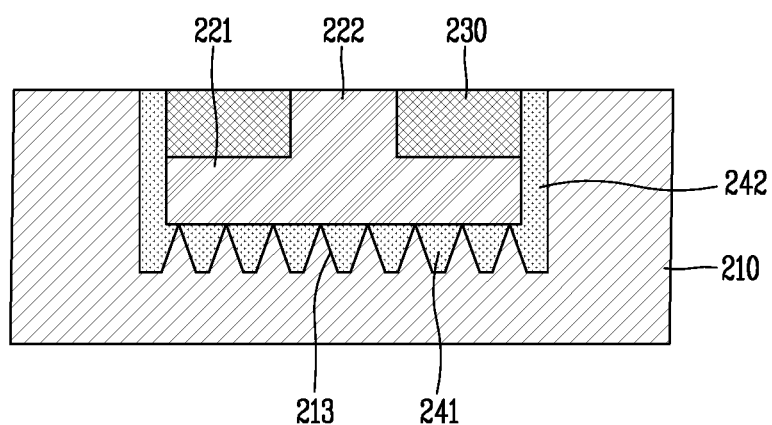
FIG. 10 is a cross-sectional view illustrating an example phosphor module having an example concavo-convex structure on an example bottom surface of the hole.

FIG. 10 is a cross-sectional view illustrating a phosphor module having a concavo-convex structure on a bottom surface.

Referring to FIG. 10, a concave-convex structure 213 may be formed on the bottom surface of the hole. A reflectance at the bottom surface of the hole may be reduced due to the concave-convex structure 213. Therefore, the reflection of light directed toward a lower side of the phosphor module may be formed on the adhesive layer 240. For example, the bottom surface may include a plurality of protrusions and a plurality of recesses to form the concave-convex structure 213.

The adhesive layer 240 may be made of a white material having a high reflectivity so that the reflection of light directed toward a lower side of the phosphor module is formed by the adhesive layer 240. Furthermore, the adhesive layer 240 may be formed to be larger than a thickness of the concavo-convex structure 213 so that the adhesive layer 240 can fill a space between the concavo-convex structures 213.

In some examples, the present disclosure may include various modified implementations to prevent a reflectance at the bottom surface of the hole due to the concave-convex structure 213 from being decreased.

Figure 11A:
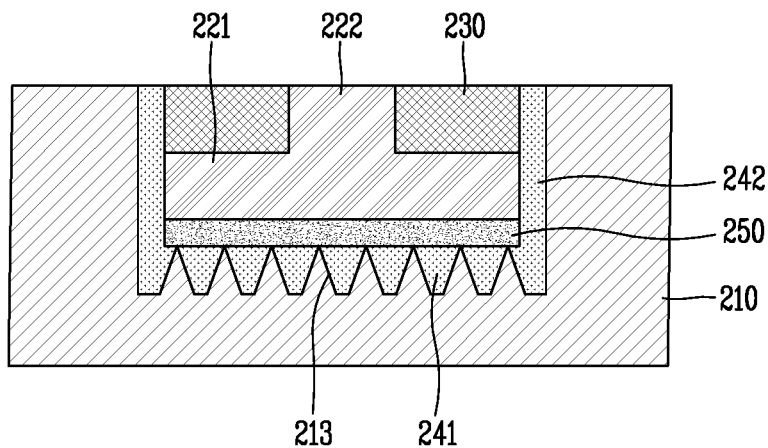
FIGS. 11A and 11B are cross-sectional views illustrating an example phosphor module having an example reflective layer on an example hole bottom surface.
Figure 11B:
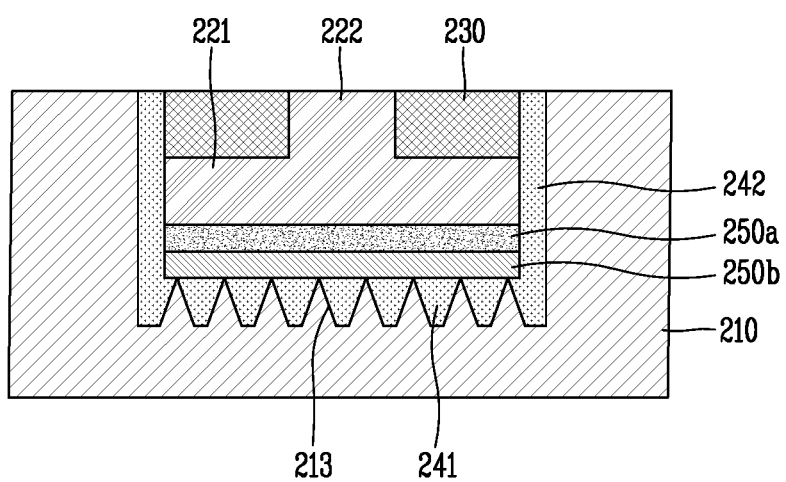

FIGS. 11A and 11B are cross-sectional views illustrating a phosphor module having a reflective layer on a hole bottom surface.

Referring to FIG. 11A, in order to increase the reflectance at the bottom surface of the hole, the present disclosure may further include a reflective film 250 disposed between the adhesive layer and the phosphor layer and formed to reflect light.

The reflective film may be made of a white material having a high reflectivity. Here, since light emitted from the phosphor layer and directed toward a lower side of the phosphor module is reflected by the reflective film 250, the adhesive layer 240 need not be formed of a material having a high reflectance.

According to the structure of FIG. 11A, light emitted from the phosphor layer and directed toward a side surface of the phosphor layer is reflected by the reflective layer 230, and light emitted from the phosphor layer and directed toward a lower surface of the phosphor layer is reflected by the reflective film 250, and thus an amount of light of the phosphor module may be increased. Through this, the present disclosure prevents an amount of light of the phosphor module from being decreased even when an area of the phosphor layer is reduced.

In some examples, the reflective film 250 may not be fabricated together with the phosphor layer 220 and the reflective layer 230 but may be additionally coated on the phosphor layer 220. In this case, the reflective film 250 may be formed of a material different from that of the reflective layer 230.

In some examples, the reflective film 250 may be made of a material having no adhesive force. In this case, the reflective film 250 may not be bonded to the phosphor layer 220. In case where the reflective film 250 and the phosphor layer 220 are not bonded to each other, the phosphor layer 220 is fixed to the heat radiator 210 only by an adhesive layer formed on a side surface of the reflective layer 230. Therefore, a durability of the phosphor module may be reduced.

In order to prevent this, the reflective film may include a first layer 250b bonded to the adhesive layer 240 and made of a metal or an alloy, and a second layer 250a formed on the first layer 250b to bond the first layer 250b to the phosphor layer 220.

Here, since the first layer 250b is made of a metal having a high reflectance, the first layer 250b performs a substantial reflection function and performs a heat dissipation function. In some examples, the second layer 250a bonds the first layer 250b and the phosphor layer 220 to improve the durability of the phosphor module.

Since light output from the phosphor layer 220 and directed toward a lower side of the phosphor module may be reflected by the first layer 250b, the second layer 250a may be formed of a light-transmitting material.

According to the structure of FIG. 11B, light emitted from the phosphor layer and directed toward a side surface of the phosphor layer is reflected by the reflective layer 230, and light emitted from the phosphor layer and directed toward a lower surface of the phosphor layer is reflected by the first layer 240b included in the reflective film, and thus an amount of light of the phosphor module may be increased. Through this, the present disclosure prevents an amount of light of the phosphor module from being decreased even when an area of the phosphor layer is reduced.

In some examples, the present disclosure provides a structure for widely spreading laser light reflected from the phosphor module to minimize a yellow ring.

Part of blue laser light incident on the phosphor module is reflected by the phosphor layer and directed to an upper side of the phosphor module. Blue light directed toward an upper side of the phosphor module is combined with yellow light output from the phosphor layer. At this time, a yellow ring is generated because the yellow light output from the phosphor layer spreads more widely than the blue light reflected from the phosphor layer.

The present disclosure may provide a structure in which blue light reflected by a phosphor layer widely spreads to be combined with yellow light. For example, a concavo-convex structure may be formed on a surface of the protrusion portion formed on the phosphor layer 220.

The concave-convex structure irregularly diffuses part of blue laser light incident on the phosphor layer 220. Through this, blue light reflected by the phosphor layer 220 may be spread more widely, and an amount of blue light that can be combined with yellow light increases, thereby reducing an area of the yellow ring.

Hereinafter, an effect of increasing an amount of light of the phosphor module will be described.

In this example experiment, after the reflective layer is formed of $TiO_2$ silicone resin at a side surface of the phosphor layer, the amount of light is compared with a phosphor module on which the reflective layer is not formed. For a comparison between the phosphor modules, the brightness of light output from the phosphor modules were measured after irradiating blue laser light with the same intensity. The measurement results are shown in Table 1 below.

TABLE 1

| Phosphor thickness | 0.1 mm | | 0.2 mm | |
|---|---|---|---|---|
| Presence of reflective layer | X | ○ | X | ○ |
| Brightness of phosphor surface (lm) | 536 | 587 (increase by 10%) | 515 | 577 (increase by 12%) |

Referring to Table 1, it may be seen that a reflective layer with the phosphor module increases the brightness of the phosphor module.

It should be understood by those skilled in the art that the present disclosure can be implemented in other specific forms without departing from the concept and essential characteristics thereof.

Furthermore, the detailed description thereof should not be construed as restrictive in all aspects but considered as illustrative. The scope of the invention should be determined by reasonable interpretation of the appended claims and all changes that come within the equivalent scope of the invention are included in the scope of the invention.

What is claimed is:

1. A phosphor module for a laser light source, the phosphor module comprising:
   a heat radiator;
   a phosphor layer disposed at the heat radiator to absorb and emit light, a wavelength of the emitted light being different from a wavelength of the absorbed light; and
   a reflective layer disposed on a surface of the phosphor layer and configured to reflect light,
   wherein the phosphor layer comprises a protrusion portion that protrudes from the surface of the phosphor layer and that extends through the reflective layer,
   wherein the heat radiator defines a recess having a plurality of side surfaces and a bottom surface, and
   wherein the phosphor layer is disposed on the bottom surface of the recess.

2. The phosphor module of claim 1, further comprising an adhesive layer between the phosphor layer and the heat radiator, the adhesive layer being configured to couple the phosphor layer to the heat radiator.

3. The phosphor module of claim 2, wherein the reflective layer comprises an extension portion that extends from an end of the reflective layer and that covers a side surface of the phosphor layer.

4. The phosphor module of claim 3, wherein the adhesive layer extends from an end of the adhesive layer toward the extension portion of the reflective layer to thereby couple the extension portion of the reflective layer to the heat radiator.

5. The phosphor module of claim 2, wherein the adhesive layer comprises a Sn—Ag—Cu-based soldering material, a Sn—Au-based soldering material, a Sn—Bi-based soldering material, or an Ag-containing resin material.

6. The phosphor module of claim 1, further comprising an adhesive layer disposed at the bottom surface of the recess and configured to couple at least one of the phosphor layer or the reflective layer to the bottom surface of the recess.

7. The phosphor module of claim 6, wherein the adhesive layer comprises:
   a first region disposed on the bottom surface of the recess; and
   a second region that extends from the first region along a side surface of the recess among the plurality of side surfaces, the second region of the adhesive layer being configured to couple at least one of the phosphor layer or the reflective layer to the side surface of the recess.

8. The phosphor module of claim 7, wherein the bottom surface of the recess includes a plurality of protrusions and a plurality of recesses.

9. The phosphor module of claim 8, further comprising a reflective film disposed between the adhesive layer and the phosphor layer and configured to reflect light.

10. The phosphor module of claim 9, wherein the reflective layer is made of a first material, and wherein the reflective film is made of a second material that is different from the first material.

11. The phosphor module of claim 9, wherein the reflection film comprises:
   a first layer that contacts the adhesive layer, the first layer comprising a metal material or an alloy; and
   a second layer disposed on the first layer and configured to couple the first layer of the reflection film to the phosphor layer.

12. The phosphor module of claim 6, wherein a lower surface of the phosphor layer contacts the adhesive layer, and a side surface of the phosphor layer contacts a side surface of the recess among the plurality of side surfaces.

13. The phosphor module of claim 7, wherein the second region of the adhesive layer is configured to contact a side surface of each of the reflective layer and the phosphor layer and to couple the side surface of each of the phosphor layer and the reflective layer to the side surface of the recess.

14. The phosphor module of claim 1, wherein the reflective layer comprises a mixture of titanium oxide and at least one of alumina ($Al_2O_3$), spinel ($MgAl_2O_4$), or aluminum oxynitride (AlON).

15. The phosphor module of claim 1, wherein the reflective layer comprises a ceramic material configured to transmit heat generated from the phosphor layer to the reflective layer.

16. The phosphor module of claim 1, wherein the reflective layer comprises $TiO_2$, $Ti_2O_3$, or $Al_2O_3$.

17. The phosphor module of claim 1, wherein the protrusion portion of the phosphor layer comprises a first surface that contacts the reflective layer, and a second surface that is exposed to an outside of the heat radiator.

18. The phosphor module of claim 1, further comprising an adhesive layer disposed between the heat radiator and the phosphor layer and configured to define a space between the reflective layer and the heat radiator.

19. A phosphor module for a laser light source, the phosphor module comprising:
   a heat radiator;
   a phosphor layer disposed at the heat radiator to absorb and emit light, a wavelength of the emitted light being different from a wavelength of the absorbed light; and
   a reflective layer disposed on a surface of the phosphor layer and configured to reflect light,
   wherein the phosphor layer comprises a protrusion portion that protrudes from the surface of the phosphor layer and that extends through the reflective layer, and
   wherein a top surface of the protrusion portion of the phosphor layer and a top surface of the reflective layer are coplanar with a top surface of the heat radiator.

* * * * *